United States Patent
Nakayamada et al.

(10) Patent No.: US 8,563,953 B2
(45) Date of Patent: Oct. 22, 2013

(54) CHARGED PARTICLE BEAM WRITING APPARATUS AND CHARGED PARTICLE BEAM WRITING METHOD

(75) Inventors: Noriaki Nakayamada, Kanagawa (JP); Makoto Hiramoto, Shizuoka (JP); Jun Yashima, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 229 days.

(21) Appl. No.: 13/235,432

(22) Filed: Sep. 18, 2011

(65) Prior Publication Data
US 2012/0068089 A1 Mar. 22, 2012

(30) Foreign Application Priority Data
Sep. 22, 2010 (JP) ................................. 2010-212419

(51) Int. Cl.
*H01J 37/147* (2006.01)
*H01J 19/08* (2006.01)

(52) U.S. Cl.
USPC ............. 250/492.23; 250/492.22; 250/396 R

(58) Field of Classification Search
USPC .................. 250/396 R, 492.1, 492.2, 492.22, 250/492.23, 492.3; 430/296, 942
See application file for complete search history.

(56) References Cited

U.S. PATENT DOCUMENTS

| | | | |
|---|---|---|---|
| 5,847,959 A * | 12/1998 | Veneklasen et al. | .......... 700/121 |
| 6,379,851 B1 | 4/2002 | Innes | |
| 6,420,717 B1 | 7/2002 | Babin et al. | |
| 6,720,565 B2 | 4/2004 | Innes et al. | |
| 7,612,347 B2 | 11/2009 | Hiramoto | |
| 7,705,327 B2 | 4/2010 | Horiuchi et al. | |
| 8,065,635 B2 | 11/2011 | Yashima et al. | |
| 2007/0243487 A1 | 10/2007 | Anze et al. | |
| 2008/0265174 A1 | 10/2008 | Hiramoto et al. | |
| 2009/0200488 A1 | 8/2009 | Yashima et al. | |
| 2009/0242787 A1 | 10/2009 | Nakayamada et al. | |

(Continued)

FOREIGN PATENT DOCUMENTS

| | | |
|---|---|---|
| JP | 10-289849 | 10/1998 |
| JP | 2910460 | 4/1999 |

(Continued)

OTHER PUBLICATIONS

U.S. Appl. No. 13/111,311, filed May 19, 2011, Yashima.

(Continued)

*Primary Examiner* — Bernard E Souw
(74) *Attorney, Agent, or Firm* — Oblon, Spivak, McClelland, Maier & Neustadt, L.L.P.

(57) ABSTRACT

A charged particle beam writing apparatus includes a unit calculating a total charge amount of charged particle beams irradiating each minimum deflection region in deflection regions having different deflection sizes respectively deflected by deflectors of a plurality of levels for deflecting charged particle beams, a unit calculating a representative temperature of the each minimum deflection region based on heat transfer from other minimum deflection regions having been written before the each minimum deflection region is written, a unit inputting a first dose of a shot of each charged particle beam irradiating the each minimum deflection region, and modulating the first dose by using the representative temperature of the each minimum deflection region, and a unit including the deflectors of a plurality of levels and writing a pattern in the each minimum deflection region with a second dose, which has been modulated, by using the deflectors of a plurality of levels.

10 Claims, 7 Drawing Sheets

(56) References Cited

U.S. PATENT DOCUMENTS

| | | |
|---|---|---|
| 2010/0015537 A1 | 1/2010 | Emi et al. |
| 2010/0072390 A1 | 3/2010 | Yashima |
| 2010/0173235 A1 | 7/2010 | Kato et al. |
| 2010/0178611 A1 | 7/2010 | Anze et al. |
| 2010/0237253 A1 | 9/2010 | Yashima |
| 2011/0012031 A1 | 1/2011 | Shibata et al. |
| 2011/0031387 A1 | 2/2011 | Nakayamada et al. |
| 2011/0046762 A1 | 2/2011 | Yashima |
| 2011/0121208 A1 | 5/2011 | Nakayamada et al. |
| 2011/0291029 A1* | 12/2011 | Yashima .................... 250/492.3 |
| 2012/0001097 A1* | 1/2012 | Yashima et al. ......... 250/492.22 |
| 2012/0007002 A1* | 1/2012 | Nakayamada et al. .. 250/492.22 |
| 2012/0126145 A1* | 5/2012 | Yashima .................... 250/492.3 |

FOREIGN PATENT DOCUMENTS

| | | |
|---|---|---|
| JP | 2003-530711 | 10/2003 |
| JP | 2004-505462 | 2/2004 |
| JP | 2005-508528 | 3/2005 |
| JP | 2007-157742 | 6/2007 |
| JP | 2007-329187 | 12/2007 |
| JP | 4364310 | 8/2009 |

OTHER PUBLICATIONS

U.S. Appl. No. 13/163,111, filed Jun. 17, 2011, Yashima et al..
U.S. Appl. No. 13/170,426, filed Jun. 28, 2011, Nakayamada et al.
U.S. Appl. No. 13/288,530, filed Nov. 3, 2011, Yashima.
U.S. Appl. No. 13/765,140, filed Feb. 12, 2013, Kato et al.

* cited by examiner

CS_TD_COLUMN_WISE = 0

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2010-212419 filed on Sep. 22, 2010 in Japan, the entire contents of which are incorporated herein by reference.

BACKGROUND OF THE INVENTION

1. Field of the Invention

The present invention relates to a charged particle beam writing apparatus and a charged particle beam writing method. For example, it relates to an apparatus and a method for correction of resist heating.

2. Description of Related Art

The microlithography technique which advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam writing technique, which intrinsically has excellent resolution, is used for producing such a highly precise master pattern.

FIG. 7 is a schematic diagram for explaining operations of a variable-shaped electron beam (EB) writing apparatus. As shown in the figure, the variable-shaped electron beam writing apparatus operates as follows: A first aperture plate 410 has a quadrangular, such as a rectangular, opening 411 for shaping an electron beam 330. A second aperture plate 420 has a variable-shape opening 421 for shaping the electron beam 330 that has passed through the opening 411 into a desired rectangular shape. The electron beam 330 emitted from a charged particle source 430 and having passed through the opening 411 is deflected by a deflector to pass through a part of the variable-shape opening 421 and thereby to irradiate a target workpiece or "sample" 340 mounted on a stage which continuously moves in one predetermined direction (e.g. X direction) during the writing. In other words, a rectangular shape capable of passing through both the opening 411 and the variable-shape opening 421 is used for pattern writing in the writing region of the target workpiece 340 on the stage. This method of forming a given shape by letting beams pass through both the opening 411 of the first aperture plate 410 and the variable-shape opening 421 of the second aperture plate 420 is referred to as a variable shaped beam (VSB) method.

With development of optical lithography and tendency of wavelength shortening using EUV, the number of electron beam shots necessary for mask writing is increasing at an accelerated rate. Meanwhile, in order to maintain the accuracy of line width required for microminiaturization, it is planned to reduce shot noise or pattern edge roughness by increasing the dose of an electron beam by using a resist with low sensitivity. Thus, since the number of shots and the dose of irradiation are continuing to increase without end, the writing time also increases unlimitedly. Therefore, it is considered to shorten the writing time by increasing current density.

However, when providing irradiation energy of an increased quantity of electrons with higher current density in a short time, there is a problem of a phenomenon referred to as "resist heating" in which the resist sensitivity changes due to overheating of the substrate therefore the line width accuracy is degraded.

BRIEF SUMMARY OF THE INVENTION

In accordance with one aspect of the present invention, a charged particle beam writing apparatus includes a total charge amount calculation unit configured to calculate a total charge amount of charged particle beams irradiating each minimum deflection region in deflection regions having different deflection sizes respectively deflected by deflectors of a plurality of levels for deflecting charged particle beams, a representative temperature calculation unit configured to calculate a representative temperature of the each minimum deflection region based on heat transfer from other minimum deflection regions having been written before the each minimum deflection region is written, a dose modulation unit configured to input a first dose of a shot of each charged particle beam irradiating the each minimum deflection region, and to modulate the first dose by using the representative temperature of the each minimum deflection region, and a writing unit configured to include the deflectors of a plurality of levels and to write a pattern in the each minimum deflection region with a second dose, which has been modulated, by using the deflectors of a plurality of levels.

In accordance with another aspect of the present invention, a charged particle beam writing method includes calculating a total charge amount of charged particle beams irradiating each minimum deflection region in deflection regions having different deflection sizes respectively deflected by deflectors of a plurality of levels for deflecting charged particle beams, calculating a representative temperature of the each minimum deflection region based on heat transfer from other minimum deflection regions having been written before the each minimum deflection region is written, inputting a first dose of a shot of each charged particle beam irradiating the each minimum deflection region, and modulating the first dose by using the representative temperature of the each minimum deflection region, and writing a pattern in the each minimum deflection region with a second dose, which has been modulated, by using the deflectors of a plurality of levels.

DETAILED DESCRIPTION OF THE INVENTION

In the following embodiments, there will be described a structure in which an electron beam is used as an example of a charged particle beam. However, the charged particle beam is not limited to the electron beam, and other charged particle beam, such as anion beam, may also be used. Also, a variable-shaped electron beam writing apparatus will be described as an example of the charged particle beam apparatus.

In the embodiments below, there will be described an apparatus and a method that can perform writing while suppressing the pattern dimension variation due to resist heating.

Embodiment 1

Figure 1:
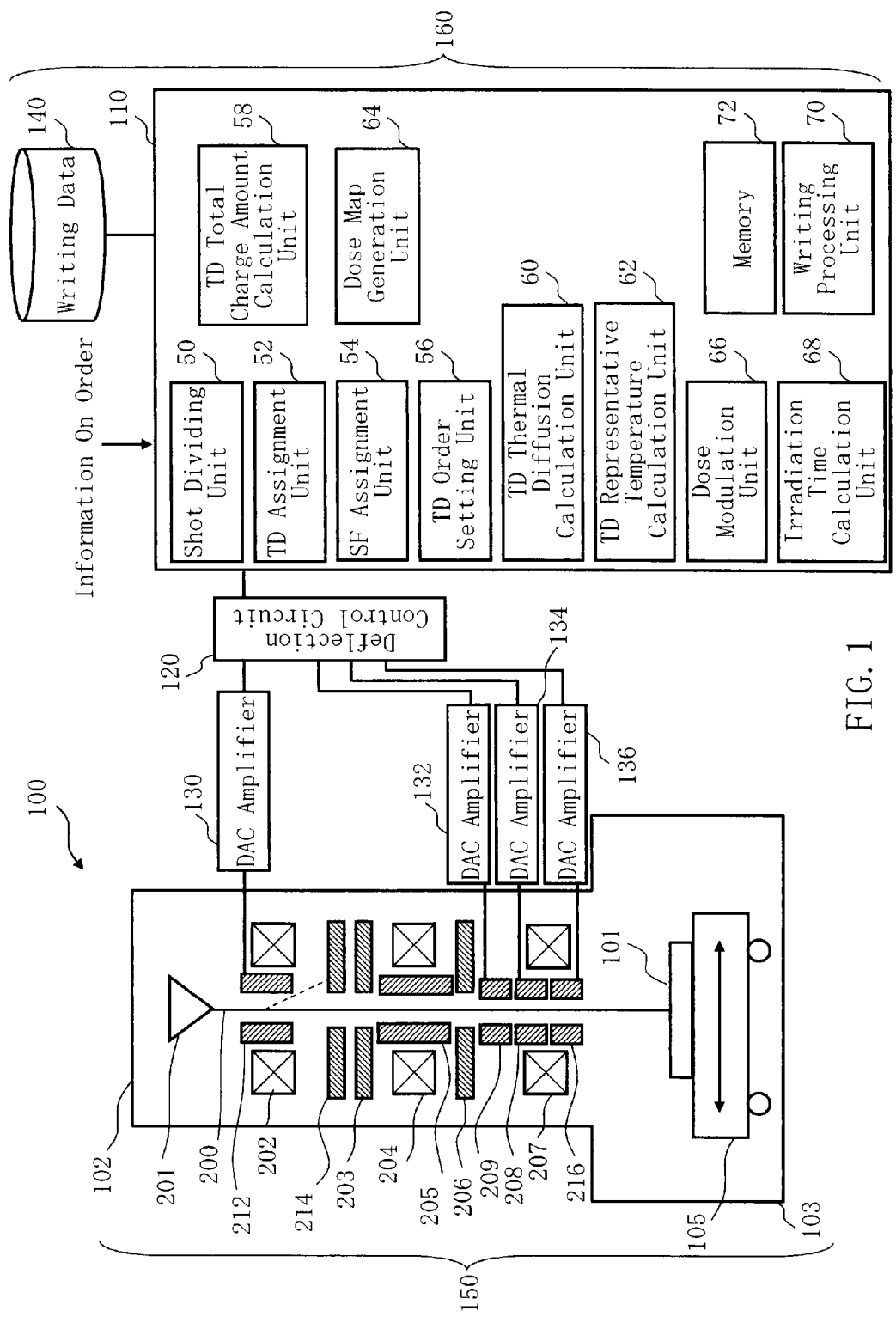
FIG. 1 is a schematic diagram showing a structure of a writing apparatus according to Embodiment 1.

FIG. 1 is a schematic diagram showing a structure of a writing apparatus according to Embodiment 1. In FIG. 1, a writing apparatus 100 includes a writing unit 150 and a control unit 160. The writing apparatus 100 is an example of a charged particle beam writing apparatus, and especially, an example of a variable-shaped electron beam (VSB) writing apparatus. The writing unit 150 includes an electron-optical column 102 and a writing chamber 103. In the electron-optical column 102, there are arranged an electron gun assembly 201, an illumination lens 202, a blanking deflector (blanker) 212, a blanking aperture 214, a first shaping aperture 203, a projection lens 204, a shaping deflector 205, a second shaping aperture 206, an objective lens 207, a main deflector 208, a sub deflector 209, and a sub-sub deflector 216. In the writing chamber 103, there is arranged an XY stage 105 that is movable at least in the XY direction. On the XY stage 105, there is placed a target workpiece 101 (substrate) serving as a writing target on which surface a resist film is coated. The target workpiece 101 is, for example, a mask for exposure, a silicon wafer, etc., used for manufacturing semiconductor devices. The mask is, for example, a mask blank where no patterns are formed.

The control unit 160 includes a control computer unit 110, a deflection control circuit 120, a DAC (digital analog converter) amplifier units 130, 132, 134, and 136 (deflection amplifiers), and a storage device 140 such as a magnetic disk drive. The control computer unit 110, the deflection control circuit 120, and the storage device 140 such as a magnetic disk drive are mutually connected through a bus (not shown). To the deflection control circuit 120, there are connected the DAC amplifier units 130, 132, 134, and 136. The DAC amplifier unit 130 is connected to the blanking deflector 212. The DAC amplifier unit 132 is connected to the sub deflector 209. The DAC amplifier unit 134 is connected to the main deflector 208. The DAC amplifier unit 136 is connected to the sub-sub deflector 216.

Moreover, in the control computer unit 110, there are arranged a shot dividing unit 50, an under subfield (USF: hereinafter referred to as "TD" being an abbreviation for Tertiary Deflection which means the third deflection) assignment unit 52, a subfield (SF) assignment unit 54, a TD order setting unit 56, a TD total charge amount calculation unit 58, a TD thermal diffusion calculation unit 60, a TD representative temperature calculation unit 62, a dose map generating unit 64, a dose modulation unit 66, an irradiation time calculation unit 68, a writing processing unit 70, and a memory 72. Each function of the above-described units may be configured by software such as a program, or alternatively, may be configured by hardware such as an electronic circuit. Alternatively, it may be configured by a combination of software and hardware. Input data and a calculated result generated in the control computer unit 110 are stored in the memory 72 each time.

Writing data is input from the outside and stored in the storage device 140.

FIG. 1 shows a structure necessary for describing Embodiment 1. Other structure elements generally necessary for the writing apparatus 100 may also be included.

Figure 2:
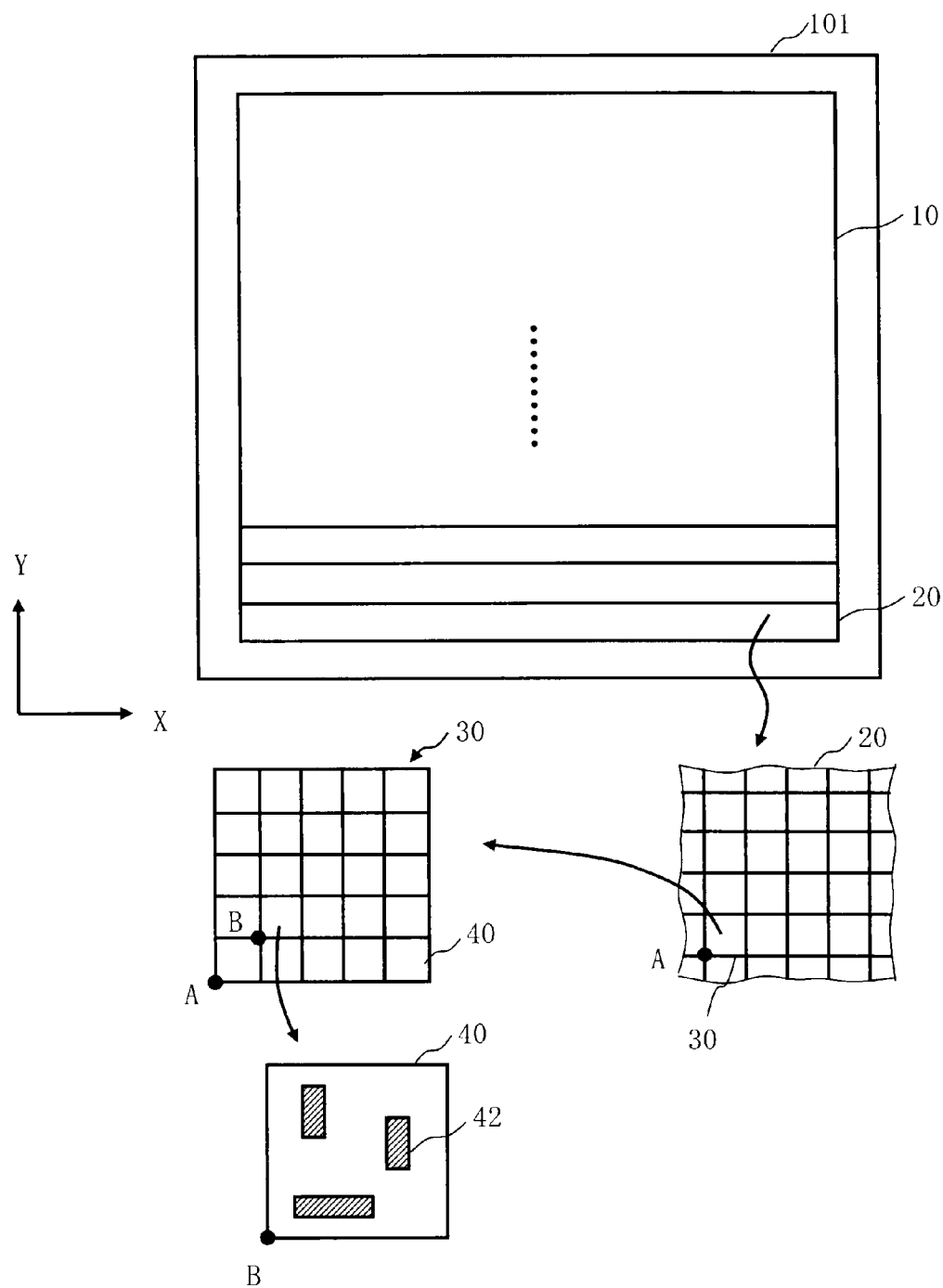
FIG. 2 is a schematic diagram for explaining each region in Embodiment 1.

FIG. 2 is a schematic diagram for explaining each region in Embodiment 1. In FIG. 2, a writing region 10 of the target workpiece 101 is virtually divided, for example in the y direction, into a plurality of strip-like stripe regions 20 each having a width deflectable by the main deflector 208. Moreover, each stripe region 20 is virtually divided into a plurality of mesh-like subfields (SFs) (first small regions) 30 each having a size deflectable by the sub deflector 209. Further, each SF 30 is virtually divided into a plurality of mesh-like under subfields (TDs) (second small regions) each having a size deflectable by the sub-sub deflector 216. A shot figure is written at each shot position 42 in each TD 40. It is preferable for the number of divided TDs in each SF to be a number that produces a state in which a writing operation is not limited by calculation of thermal diffusion of TD. For example, it is preferable to be ten or less divisions in each horizontal or vertical axis, and it is further preferable to be five or less divisions in each horizontal or vertical axis.

A digital signal for blanking control is output from the deflection control circuit 120 to the DAC amplifier unit 130. The DAC amplifier unit 130 converts the digital signal to an analog signal and amplifies it to be applied as a deflection voltage to the blanking deflector 212. The electron beam 200 is deflected by the deflection voltage so as to form a beam shot.

A digital signal for controlling main deflection is output from the deflection control circuit 120 to the DAC amplifier unit 134. The DAC amplifier unit 134 converts the digital signal to an analog signal and amplifies it to be applied as a deflection voltage to the main deflector 208. The electron beam 200 is deflected by the deflection voltage, and thereby each shot beam is deflected to a reference position of a pre-determined subfield (SF) virtually divided to be mesh-like.

A digital signal for controlling sub deflection is output from the deflection control circuit 120 to the DAC amplifier unit 132. The DAC amplifier unit 132 converts the digital signal to an analog signal and amplifies it to be applied as a deflection voltage to the sub deflector 209. The electron beam 200 is deflected by the deflection voltage, and thereby each shot beam is deflected to a reference position of an under subfield (TD) which has been made by further virtually divided to be mesh-like and be a minimum deflection region, in a predetermined subfield (SF) virtually divided to be mesh-like.

A digital signal for controlling sub-sub deflection is output from the deflection control circuit 120 to the DAC amplifier unit 136. The DAC amplifier unit 136 converts the digital signal to an analog signal and amplifies it to be applied as a deflection voltage to the sub-sub deflector 216. The electron beam 200 is deflected by the deflection voltage, and thereby each shot beam is deflected to a shot position in an under subfield (TD) which has been made by further virtually divided to be mesh-like and be a minimum deflection region, in a predetermined subfield (SF) virtually divided to be mesh-like.

The writing apparatus 100 performs writing processing in each stripe region 20 by using deflectors of a plurality of levels. In this case, deflectors of three stages, such as the main deflector 208, the sub deflector 209, and the sub-sub deflector 216, are used as an example. While the XY stage 105 is continuously moving in the −x direction, for example, the first stripe region 20 is written in the x direction. After the first stripe region 20 has been written, the second stripe region 20 is written similarly or written in the opposite direction. Then, in the same way, the third and subsequent stripe regions 20 are written. The main deflector 208 (the first deflector) deflects the electron beam 200 in order to the reference position A of the SF 30 such that the movement of the XY stage 105 is followed. The sub deflector 209 (the second deflector) deflects the electron beam 200 in order from the reference position A of each SF 30 to the reference position B of the TD 40. Further, the sub-sub deflector 216 (the third deflector) deflects the electron beam 200 in order from the reference position B of each TD 40 to the shot position 42 of a beam irradiating the TD 40 concerned. Thus, the sizes of the deflection regions of the main deflector 208, the sub deflector 209, and the sub-sub deflector 216 are different from each other. The TD 40 is the minimum deflection region in the deflection regions of the deflectors of a plurality of levels.

Figure 3:
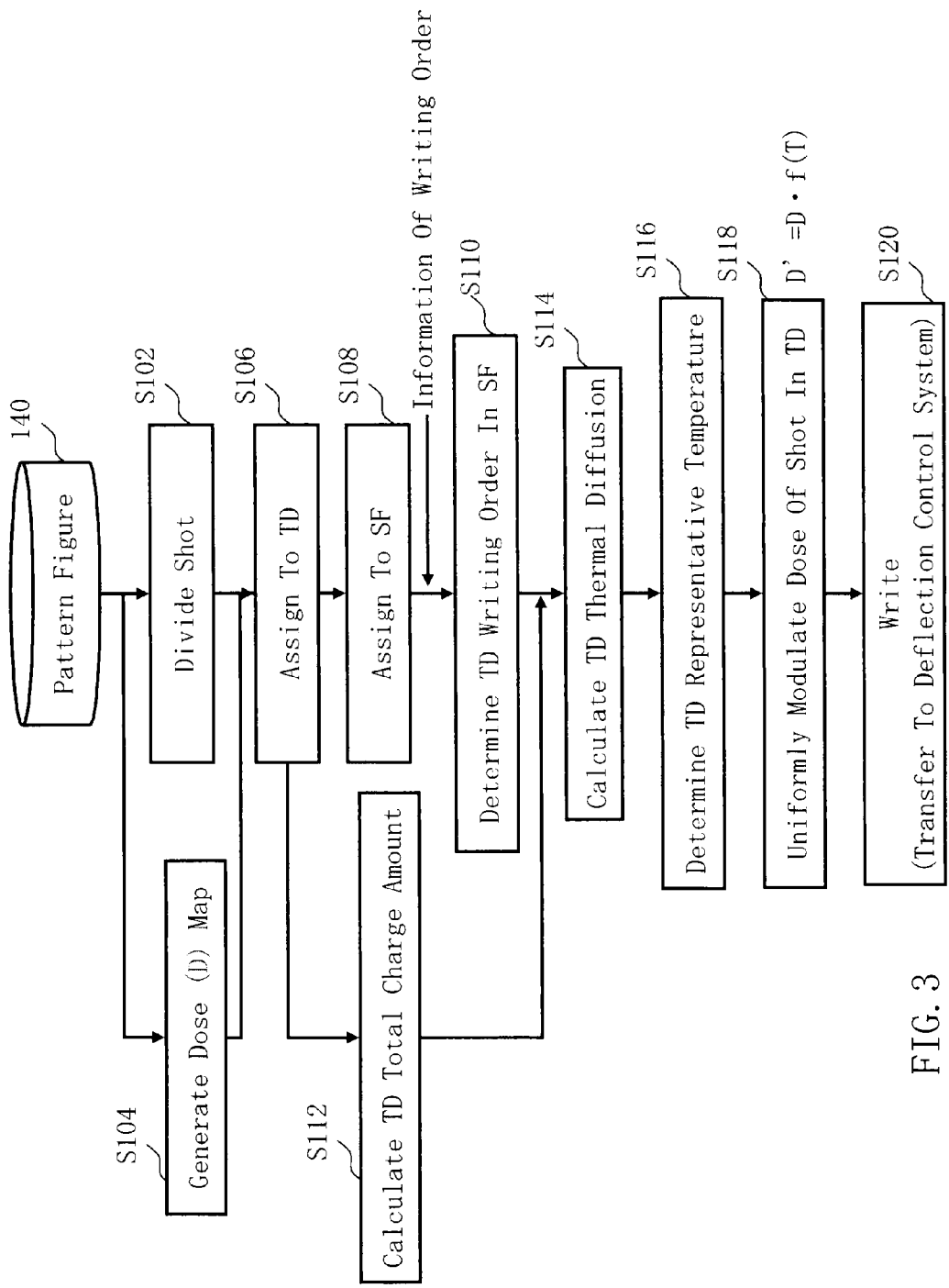
FIG. 3 is a flowchart showing the main steps of a writing method according to Embodiment 1.

FIG. 3 is a flowchart showing the main steps of the writing method according to Embodiment 1. In FIG. 3, the writing method of Embodiment 1 executes a series of steps: a shot dividing step (S102), a dose map generating step (S104), an under subfield (TD) assignment step (S106), a subfield (SF) assignment step (S108), a TD order setting step (S110), a TD total charge amount calculation step (S112), a TD thermal diffusion calculation step (S114), a TD representative temperature calculation step (S116), a dose modulation step (S118), and a writing step (S120).

In the shot dividing step (S102), the shot dividing unit 50 inputs writing data from the storage device 140, performs data conversion processing of a plurality of steps, divides a pattern figure into shot figures for each shot, and generates shot data whose format is specific to the writing apparatus.

In the dose map generating step (S104), the dose map generation unit 64 calculates a necessary dose (the first dose) for each mesh region of a predetermined size. Then, a dose map is generated for an entire writing region or each stripe region. For example, when correcting a proximity effect, it is preferable to calculate a necessary dose for each proximity effect mesh region. Approximately 1/10 of the influence range of proximity effect is suitable for the size of the proximity effect mesh region. For example, about 1 μm is preferred. It is preferable to process the dose map generating step (S104) and the shot dividing step (S102) in parallel. However, it is not limited thereto, and they may be processed in series. In such a case, whichever may be processed first.

In the TD assignment step (S106), the TD assignment unit 52 assigns each shot data obtained by shot division to TD 40 where the shot figure concerned is to be arranged.

In the SF assignment step (S108), the SF assignment unit 54 assigns TD data, which contains shot data assigned to the TD 40, to SF 30 where the TD concerned is arranged.

In the TD order setting step (S110), the TD order setting unit 56 sets up, for each SF 30, an order of writing a plurality of TDs in the SF concerned.

In the TD total charge amount calculation step (S112), the TD total charge amount calculation unit 58 (total charge amount calculation unit) calculates, for each TD 40 being a minimum deflection region, a total charge amount of the electron beam 200 irradiating the TD 40 concerned. It is preferable for the TD total charge amount calculation step (S112) to be processed in parallel with both the steps of the SF assignment step (S108) and the TD order setting step (S110). However, it is not limited thereto, and they may be processed in series. In such a case, whichever may be processed first.

Figures 4A, 4B:
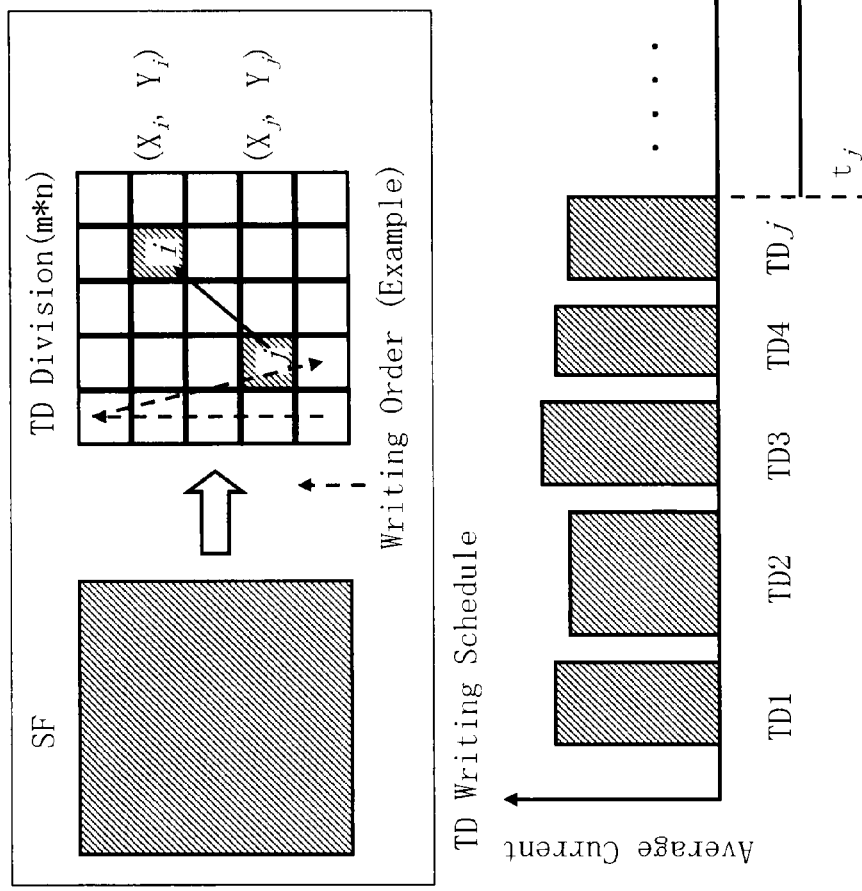
FIG. 4A is a schematic diagram showing a tertiary deflection (ID) writing schedule in subfield (SF) according to Embodiment 1.
FIG. 4B is a schematic diagram showing a total charge amount of each TD according to Embodiment 1.

FIG. 4A is a schematic diagram showing a TD writing schedule in SF and FIG. 4B is a schematic diagram showing a total charge amount of each TD according to Embodiment 1. In FIG. 4A, as an example, the TDs in the first column, which is the first with respect to the x direction, are written in the y direction in order from the lower left TD arranged in the SF. After the first column with respect to the x direction has been written, the TDs in the second column, which is the second with respect to the x direction, are written in the y direction in order. Similarly, TDs in the third and subsequent TD columns with respect to the x direction are written in order in the y direction. FIG. 4A shows the case where writing is performed according to the writing schedule as described above. The TD total charge amount calculation unit 58 calculates, for each TD 40, a total charge amount of the electron beam 200 irradiating the TD 40 concerned. A total charge amount Q is obtained by a sum of products, wherein each product is a multiplication of the area and the dose of each shot figure in the TD concerned. FIG. 4B shows average currents in accordance with the order of writing, wherein each average current is obtained by dividing the total charge amount Q by the writing time of the TD concerned.

Figure 5B:
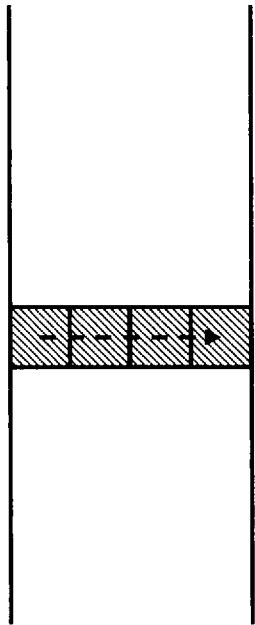
FIGS. 5A and 5B are schematic diagrams showing examples of a writing order of SFs in a stripe region according to Embodiment 1.
Figure 5A:
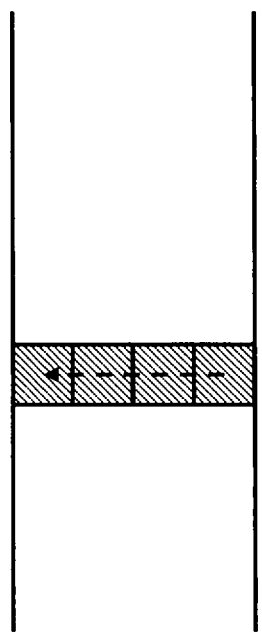
Figure 6A:
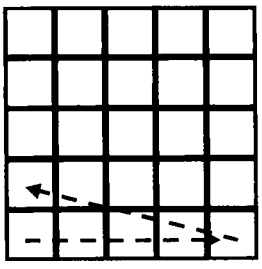
FIGS. 6A to 6H are schematic diagrams showing examples of a writing order of TDs in an SF according to Embodiment 1.

FIGS. 5A and 5B are schematic diagrams showing examples of the writing order of SFs in a stripe region according to Embodiment 1. As a writing order of SFs in each stripe region, two kinds of writing order can be prepared with respect to an SF column made by collecting a plurality of SFs arranged in each stripe region to be in the y direction. One is an upward (UWD) writing order indicating to perform writing in the y direction in order from the lower SF as shown in FIG. 5A, and the other is a downward (DWD) writing order indicating to perform writing in the −y direction in order from the upper SF as shown in FIG. 5B FIGS. 6A to 6H are schematic diagrams showing examples of the writing order of TDs in an SF according to Embodiment 1. The writing orders for TDs in each SF can be prepared as follows:

According to the writing order 0 shown in FIG. 6A, TDs in the first row, which is the first with respect to the y direction, are written in order from the lower left TD in the x direction, and TDs in the second and subsequent rows with respect to the y direction are also written in order from the left end TD in the x direction.

Figure 6B:
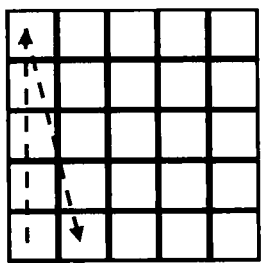

According to the writing order 1 shown in FIG. 6B, TDs in the first column, which is the first with respect to the x direction, are written in order from the lower left TD in the y direction, and TDs in the second and subsequent columns with respect to the x direction are also written in order from the lower end TD in the y direction.

Figure 6C:
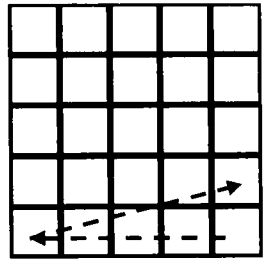

According to the writing order 2 shown in FIG. 6C, TDs in the first row, which is the first with respect to the −y direction, are written in order from the upper left TD in the x direction, and TDs in the second and subsequent rows with respect to the −y direction are also written in order from the left end TD in the x direction.

Figure 6D:
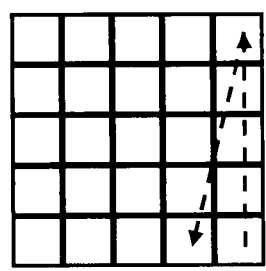

According to the writing order 3 shown in FIG. 6D, TDs in the first column, which is the first with respect to the x direction, are written in order from the upper left TD in the −y direction, and TDs in the second and subsequent columns with respect to the x direction are also written in order from the upper end TD in the −y direction.

Figure 6E:
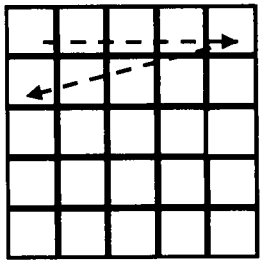

According to the writing order 4 shown in FIG. 6E, TDs in the first row, which is the first with respect to the y direction, are written in order from the lower right TD in the −x direction, and TDs in the second and subsequent rows with respect to the y direction are also written in order from the right end TD in the −x direction.

Figure 6F:
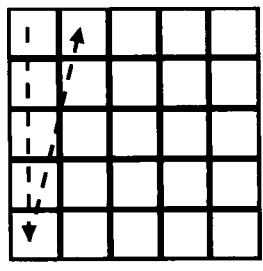

According to the writing order 5 shown in FIG. 6F, TDs in the first column, which is the first with respect to the −x direction, are written in order from the lower right TD in the y direction, and TDs in the second and subsequent columns with respect to the −x direction are also written in order from the lower end TD in the y direction.

Figure 6G:
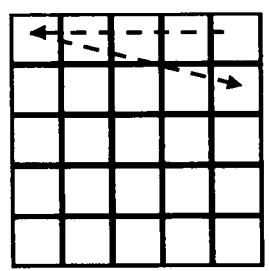

According to the writing order 6 shown in FIG. 6G, TDs in the first row, which is the first with respect to the −y direction, are written in order from the upper right TD in the −x direction, and TDs in the second and subsequent rows with respect to the −y direction are also written in order from the right end TD in the −x direction.

Figure 6H:
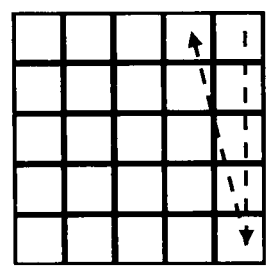
Figure 7:
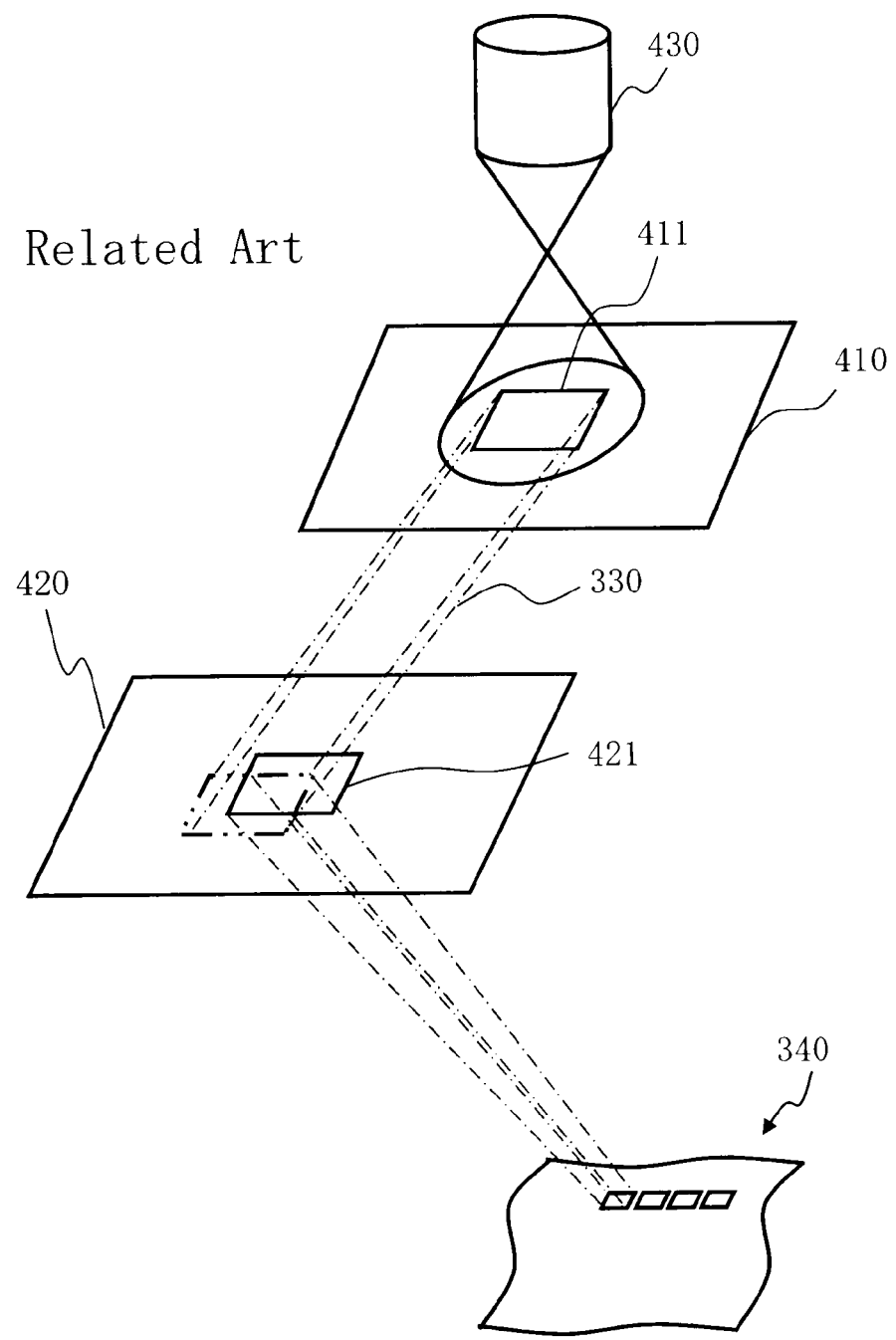
FIG. 7 is a schematic diagram for explaining operations of a variable-shaped electron beam writing apparatus.

According to the writing order 7 shown in FIG. 6H, TDs in the first column, which is the first with respect to the −x direction, are written in order from the upper right TD in the −y direction, and TDs in the second and subsequent columns with respect to the −x direction are also written in order from the upper end TD in the −y direction.

What is necessary for setting up writing orders of SF and TD is to combine the writing orders shown in FIGS. 5A to 5B and FIGS. 6A to 6H. For example, it is more preferable to set up the writing order in order of mitigating the impact of thermal diffusion.

In the TD thermal diffusion calculation step (S114), the TD thermal diffusion calculation unit 60 calculates, for each TD, a temperature increase amount δTij produced by heat transfer from other TD which has been written before the TD concerned is written. The TD thermal diffusion calculation unit 60 is an example of the temperature increase amount calculation unit. The temperature increase amount δTij indicates a temperature increase amount which the i-th TDi produces by heat transfer from other j-th TDj. The temperature increase amount δTij is dependent on an elapsed time (ti−tj) since other TD has been written at Time tj until the TD concerned is written at Time ti. The temperature increase amount δTij can be defined by the following equation (1) using a temperature increase A(Qj) of TDj only, which is dependent on a total charge amount Qj of TDj, a thermal diffusion coefficient k, a Grun Range Rg, coordinates (Xi, Yi) of TDi, coordinates (Xj, Yj) of TDj, a writing time ti of TDi, and a writing time tj of TDj. Equation (1-1) shows the case of performing an approximation so that it may be similar in the depth Z direction of a rectangular parallelepiped, and performing an approximation so that a diffusion may be ignored during irradiation of beam to TD, as an example.

$$\delta T_{ij} = A(Q_j) \cdot \mathrm{erf}\left(\frac{R_g}{2k\sqrt{t_i - t_j}}\right) \cdot \frac{1}{4\pi k^2(t_i - t_j)} \quad (1\text{-}1)$$

$$\exp\left\{-\frac{(x_i - x_j)^2 + (y_i - y_j)^2}{4k^2(t_i - t_j)}\right\}$$

If a temperature diffusivity k [m²/s] is used for redefining instead of using the thermal diffusion coefficient k [m/s$^{1/2}$], the equation (1-1) described above is replaced with the following equation (1-2).

$$\delta T_{ij} = A(Q_j) \cdot \mathrm{erf}\left(\frac{R_g}{2\sqrt{k(t_i - t_j)}}\right) \cdot \frac{1}{4\pi k(t_i - t_j)} \quad (1\text{-}2)$$

$$\exp\left\{-\frac{(X_i - X_j)^2 + (Y_i - Y_j)^2}{4k(t_i - t_j)}\right\}$$

The TD thermal diffusion calculation unit 60 calculates, for each TD in SF, each temperature increase amount Kij affected by each of all other TDs which have been written before the TD concerned is written.

In the TD representative temperature calculation step (S116), the TD representative temperature calculation unit 62 calculates, for each TD, a representative temperature Ti of the TD concerned based on heat transfer from other TDs which have been written before the TD concerned is written. The TD representative temperature calculation unit 62 is an example of a representative temperature calculation unit. The TD representative temperature calculation unit 62 calculates a representative temperature Ti of the TD concerned by accumulatively adding each of the temperature increase amounts δTij produced by heat transfer from a plurality of other TDs which have been written before the TD concerned is written. A representative temperature Ti is defined by the following equation (2).

$$T_i = \sum_{j=1}^{n} \delta T_{ij} \quad (2)$$

In the dose modulation step (S118), the dose modulation unit 66 inputs a dose D (first dose) calculated for a shot of the electron beam 200 irradiating the TDi concerned, and modulates the dose D (first dose) of each shot of the beam irradiating the TDi concerned, by using a representative temperature Ti of the TDi concerned. A modulated dose D' (second dose) can be obtained by D'=D·f(Ti). When performing a writing process with shots of beams in the TDi concerned, the same modulation rate f(Ti) is used throughout.

According to Embodiment 1, since the deflection range can be made small by using TD divided from SF and thereby smaller than SF, it is possible to speed up the DAC amplifier 136 which is for the sub-sub deflector 216. Therefore, the writing speed in each TD can be made faster than the thermal diffusion speed. Accordingly, it is possible to perform approximation ignoring thermal diffusion during irradiation of TD. Consequently, correction of resist heating can be performed highly accurately.

In the writing step (S120), first, the irradiation time calculation unit 68 calculates an irradiation time for each shot. The irradiation time can be calculated by dividing a modulated dose D' by a current density. When performing writing with each beam shot, the writing processing unit 70 controls the deflection control circuit 120 so that the irradiation time may correspond to each shot. The writing processing unit 70 controls the writing unit 150 through deflection control circuit 120 etc. and starts writing processing. The writing unit 150 writes a desired pattern on the target workpiece 101 using the electron beam 200 of a modulated dose D' obtained for each shot. Specifically, it operates as follows: The deflection control circuit 120 outputs a digital signal for controlling the irradiation time of each shot to the DAC amplifier unit 130. Then, the DAC amplifier unit 130 converts the digital signal to an analog signal and amplifies it to be applied as a deflection voltage to the blanking deflector 212.

When passing through the blanking deflector 212, the electron beam 200 emitted from the electron gun assembly 201 (emission unit) is controlled by the blanking deflector 212 to pass through the blanking aperture 214 when the beam is in the ON state, and is deflected so that the entire beam may be blocked by the blanking aperture 214 when the beam is in the OFF state. The electron beam 200 passing through the blanking aperture 214, while changing the state from the beam-OFF to the beam-ON and lastly again to the beam-OFF, serves as a one-time shot of the electron beam. The blanking deflector 212 controls the direction of the passing electron beam 200 to alternately generate the beam-ON state and the beam-OFF state. For example, it is acceptable to apply a voltage to the blanking deflector 212 when in the beam-OFF state and not to apply it when in the state of beam-ON. The dose per shot of the electron beam 200 to irradiate the target workpiece 101 is adjusted by the irradiation time of each shot.

As described above, each shot of the electron beam 200, generated by passing through the blanking deflector 212 and the blanking aperture 214, irradiates the whole of the first shaping aperture 203 which has a quadrangular opening such as a rectangular opening by the illumination lens 202. Here, the electron beam 200 is first shaped to be a quadrangle such as a rectangle. Then, after having passed through the first shaping aperture 203, the electron beam 200 of a first aperture image is projected onto the second shaping aperture 206 by the projection lens 204. The first aperture image on the second shaping aperture 206 is deflection-controlled by the shaping deflector 205 so as to change the shape and size of the beam (variable shaping). Such variable beam shaping is performed for each shot, and, usually, each of the shots is shaped to have a different shape and size. After having passed through the second shaping aperture 206, the electron beam 200 of a second aperture image is focused by the objective lens 207, and deflected by the main deflector 208, the sub deflector 209, and the sub-sub deflector 216 to reach a desired position on the target workpiece 101 placed on the XY stage 105 which moves continuously. As described above, a plurality of shots of the electron beam 200 are deflected in order by a respective deflector onto the target workpiece 101 serving as a substrate.

According to Embodiment 1, as described above, correction of resist heating can be performed highly accurately. Consequently, pattern dimension variation due to resist heating can be inhibited. Therefore, it is possible to write dimensions of a pattern highly accurately.

Referring to specific examples, Embodiments have been described above. However, the present invention is not limited to these examples.

While the apparatus structure, control method, etc. not directly necessary for explaining the present invention are not described, some or all of them may be suitably selected and used when needed. For example, although description of the structure of a control unit for controlling the writing apparatus 100 is omitted, it should be understood that some or all of the structure of the control unit is to be selected and used appropriately.

In addition, any other charged particle beam writing apparatus and method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
    a total charge amount calculation unit configured to calculate a total charge amount of charged particle beams irradiating each minimum deflection region in deflection regions having different deflection sizes respectively deflected by deflectors of a plurality of levels for deflecting charged particle beams;
    a representative temperature calculation unit configured to calculate a representative temperature of the each minimum deflection region based on heat transfer from other minimum deflection regions having been written before the each minimum deflection region is written;
    a dose modulation unit configured to input a first dose of a shot of each charged particle beam irradiating the each minimum deflection region, and to modulate the first dose by using the representative temperature of the each minimum deflection region; and
    a writing unit configured to include the deflectors of a plurality of levels and to write a pattern in the each minimum deflection region with a second dose, which has been modulated, by using the deflectors of a plurality of levels.

2. The apparatus according to claim 1 further comprising:
    a temperature increase amount calculation unit configured to calculate, for the each minimum deflection region, a temperature increase amount produced by heat transfer from other minimum deflection region having been written before the each minimum deflection region is written.

3. The apparatus according to claim 2, wherein the representative temperature calculation unit calculates the representative temperature of the each minimum deflection region by accumulatively adding each of temperature increase amounts produced by heat transfer from a plurality of other minimum deflection regions having been written before the each minimum deflection region is written.

4. The apparatus according to claim 2, wherein the temperature increase amount is dependent on an elapsed time since the other minimum deflection region has been written until the each minimum deflection region is written.

5. The apparatus according to claim 1, wherein the writing unit includes
    a stage on which a substrate serving as a writing target is placed and which is movable, and
    the deflectors of a plurality of levels:
    one of which is a first deflector that deflects charged particle beams in order to reference positions of a plurality of first small regions made by virtually dividing a writing region of the substrate into mesh-like regions, as following movement of the stage,
    another of which is a second deflector that deflects the charged particle beams in order from each of the reference positions of each of the plurality of first small regions to reference positions of a plurality of second small regions made by virtually dividing each of the plurality of first regions into mesh-like regions, and
    another of which is a third deflector that deflects the charged particle beams from each of the reference positions of each of the plurality of second small regions to a shot position of a beam irradiating each of the plurality of second small regions,
    wherein each of the plurality of second small regions is used as the each minimum deflection region.

6. The apparatus according to claim 5 further comprising:
    a temperature increase amount calculation unit configured to calculate, for the each minimum deflection region, a temperature increase amount produced by heat transfer from other minimum deflection region having been written before the each minimum deflection region is written.

7. The apparatus according to claim 6, wherein the representative temperature calculation unit calculates the representative temperature of the each minimum deflection region by accumulatively adding each of temperature increase amounts produced by heat transfer from a plurality of other minimum deflection regions having been written before the each minimum deflection region is written.

8. The apparatus according to claim 7, wherein the temperature increase amount is dependent on an elapsed time since the other minimum deflection region has been written until the each minimum deflection region is written.

9. The apparatus according to claim 5, wherein a dividing number of dividing the each of the plurality of first regions into the plurality of second small regions is a number that produces a state in which a writing operation is not limited by calculation of thermal diffusion of each of the plurality of second small regions.

10. A charged particle beam writing method comprising:
- calculating a total charge amount of charged particle beams irradiating each minimum deflection region in deflection regions having different deflection sizes respectively deflected by deflectors of a plurality of levels for deflecting charged particle beams;
- calculating a representative temperature of the each minimum deflection region based on heat transfer from other minimum deflection regions having been written before the each minimum deflection region is written;
- inputting a first dose of a shot of each charged particle beam irradiating the each minimum deflection region, and modulating the first dose by using the representative temperature of the each minimum deflection region; and
- writing a pattern in the each minimum deflection region with a second dose, which has been modulated, by using the deflectors of a plurality of levels.

* * * * *